(12) United States Patent
MacDonald

(10) Patent No.: US 11,211,679 B2
(45) Date of Patent: Dec. 28, 2021

(54) COMMON-MODE IN-LINE RADIO FREQUENCY FILTER ISOLATOR

(71) Applicant: PDS Electronics, Inc., Tallmadge, OH (US)

(72) Inventor: Scott T. MacDonald, Doylestown, OH (US)

(73) Assignee: PDS Electronics, Inc., Tallmadge, OH (US)

( * ) Notice: Subject to any disclaimer, the term of this patent is extended or adjusted under 35 U.S.C. 154(b) by 0 days.

(21) Appl. No.: 16/789,924

(22) Filed: Feb. 13, 2020

(65) Prior Publication Data

US 2020/0266514 A1 Aug. 20, 2020

Related U.S. Application Data

(60) Provisional application No. 62/805,387, filed on Feb. 14, 2019.

(51) Int. Cl.
*H01P 1/36* (2006.01)
*H03H 7/06* (2006.01)

(52) U.S. Cl.
CPC ................. *H01P 1/36* (2013.01); *H03H 7/06* (2013.01)

(58) Field of Classification Search
CPC ........... H01P 1/36; H01P 1/0213; H03H 7/08; H03H 7/06; H01R 13/66; H01R 13/6633; H01R 24/00
See application file for complete search history.

(56) References Cited

U.S. PATENT DOCUMENTS

| | | | |
|---|---|---|---|
| 2011/0053418 A1* | 3/2011 | Margulis | H01R 13/6461 439/620.07 |
| 2012/0092112 A1* | 4/2012 | McClelland | H01F 17/062 336/90 |
| 2012/0142199 A1* | 6/2012 | Purkis | H01R 13/719 439/39 |
| 2013/0215884 A1* | 8/2013 | Lo | G06F 13/4068 370/359 |
| 2016/0187951 A1* | 6/2016 | Buckmeier | H04L 12/10 713/300 |

* cited by examiner

*Primary Examiner* — Dean O Takaoka
(74) *Attorney, Agent, or Firm* — Timothy A. Hodgkiss; Buckingham, Doolittle & Burroughs

(57) ABSTRACT

A common-mode in-line radio frequency (RF) filter isolator includes one or more modules that incorporate a respective RF filter circuit. The one or more modules are configured to be electrically coupled in-line with a communication link, such as an Ethernet cable for example. Accordingly, the filter isolator device is enabled to reduce or eliminate the presence of common-mode noise that is present on the network communication link.

13 Claims, 6 Drawing Sheets

COMMON-MODE IN-LINE RADIO FREQUENCY FILTER ISOLATOR

CROSS-REFERENCE TO RELATED APPLICATION

This application claims the benefit of U.S. Provisional Patent Application No, 62/805,387 filed on Feb. 14, 2019, the contents of which are incorporated herein by reference.

TECHNICAL FIELD

The various embodiments disclosed herein relate to radio-frequency (RF) filter isolators for network communication devices. In particular, the various embodiments disclosed herein relate to common-mode RF filter isolators. More particularly, the various embodiments disclosed herein relate to common-mode in-line RF filter isolators.

BACKGROUND

Radio frequency (RF) communication equipment, such as that used in HAM (i.e. amateur) radio systems, utilize a variety of networked computer devices that are linked together via hardwired network communication links or cabling, such as Ethernet cables. Because of the nature of these various network communication links, they each act as separate antennas, and are susceptible to receiving unwanted RF noise. The presence of such RF noise on these links impedes, and in some cases prevents, the HAM radio from being able to recover weak signal data carried by a HAM radio carrier signal. In addition, the RF noise can also interfere with data communications that are occurring over the network communication links between each of the computer devices forming the HAM radio system. Unfortunately, current generation RF filtering circuits are cumbersome to place into operation with such RF communication equipment provided by HAM radios, and they often fail to provide an effective level of RF filtering.

Beyond HAM radio systems, the network communication links discussed above may be used to couple computer systems to various peripherals, as well as to other computer systems, such as in the case of networked computer systems, to enable the communication of data in any type of application or environment. Again, these communication links act as antennas, which are susceptible to receiving unwanted RF noise, which can be generated by any source, such as by electrical motors for example. This RF noise can dramatically impact the quality and integrity of the data being transferred among the networked computer systems and the peripherals. In some cases, the quality of data transfer is degraded to the point that data transfer speeds are unacceptably slow, or the data being communicated itself is corrupted and rendered unusable. Accordingly, given the negative implications stemming from low-quality data transfers across network communication links, it is desirable to provide a filter isolator that prevents the RF noise from affecting the quality of data communicated on network communication links.

SUMMARY

In one or more embodiments, a radio-frequency (RF) filter isolator includes a filter circuit configured to filter common-mode noise, the filter circuit having a first interface and a second interface. The first interface and the second interface are configured to be selectively electrically coupled in-line with a communication link.

In yet another embodiment, a radio-frequency (RF) filter isolator includes a first filter circuit configured to filter common-mode noise and a second filter circuit configured to filter common-mode noise. The first filter circuit includes a first output interface and a first input interface, and the second filter circuit includes a second output interface and a second input interface. Whereby, the first output interface of the first filter circuit is coupled to the second output interface of the second filter circuit and said first input interface of said first and second filter circuits are adapted to be selectively electrically coupled in-line with a communication link.

BRIEF DESCRIPTION OF THE DRAWINGS

The various embodiments disclosed herein will become better understood with regard to the following description and accompanying drawings, wherein.

DETAILED DESCRIPTION

Figure 1:
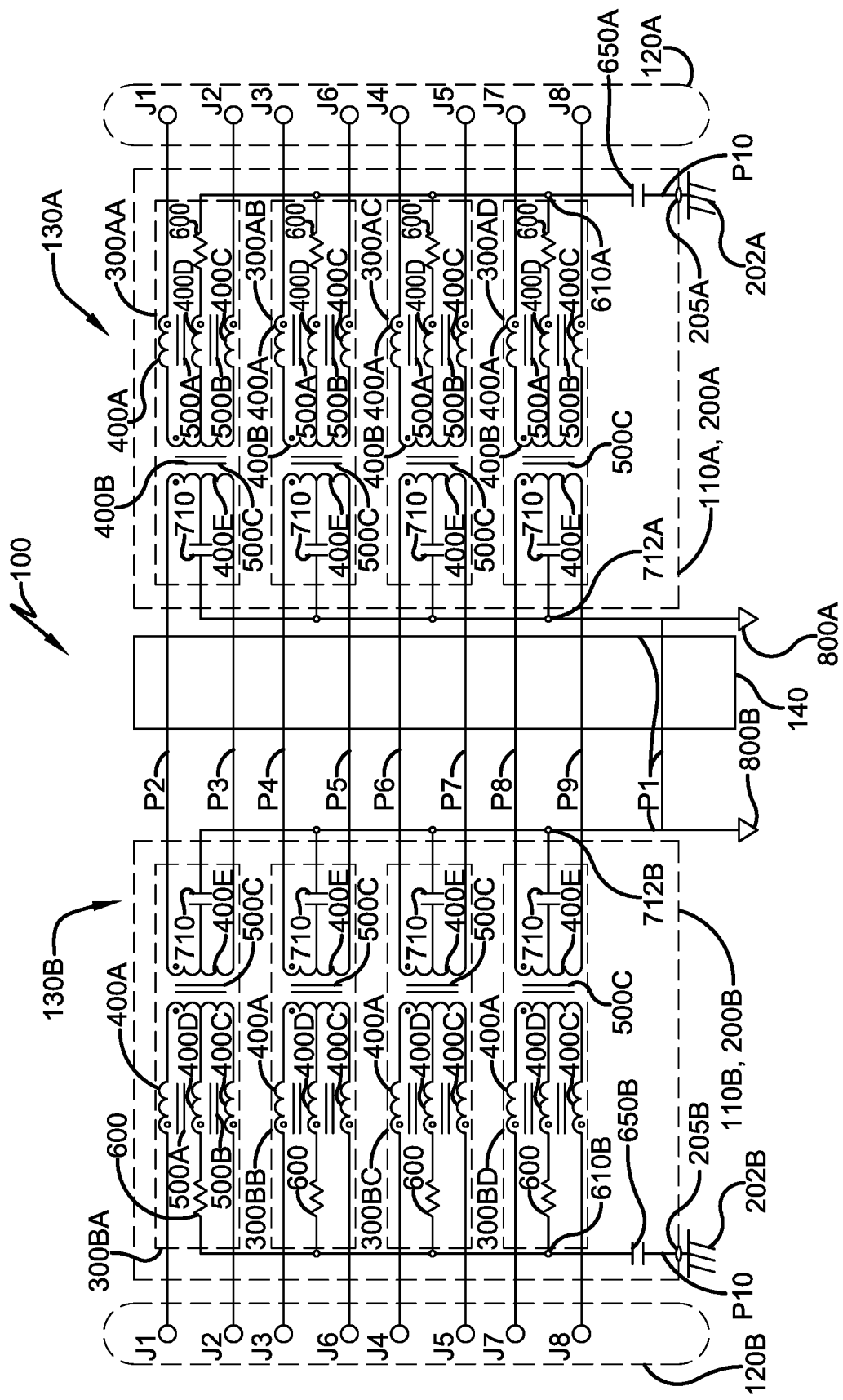
FIG. 1 is a schematic diagram of a common-mode in-line radio frequency (RF) filter isolator in accordance with the various embodiments disclosed herein.
Figure 2A:
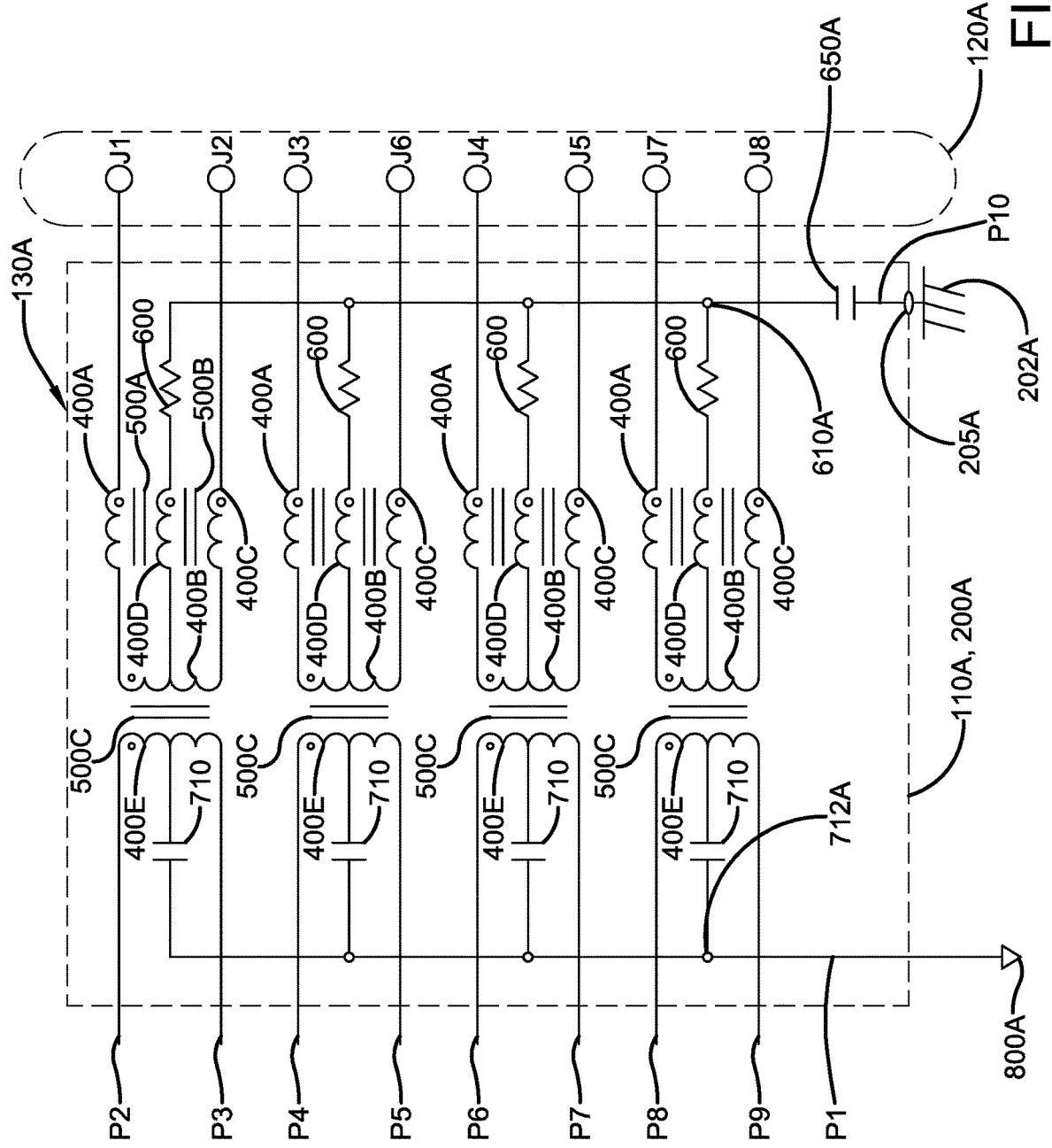
FIG. 2A is a schematic diagram of an input module of the common-mode in-line RF filter isolator in accordance with the various embodiments disclosed herein.
Figure 2B:
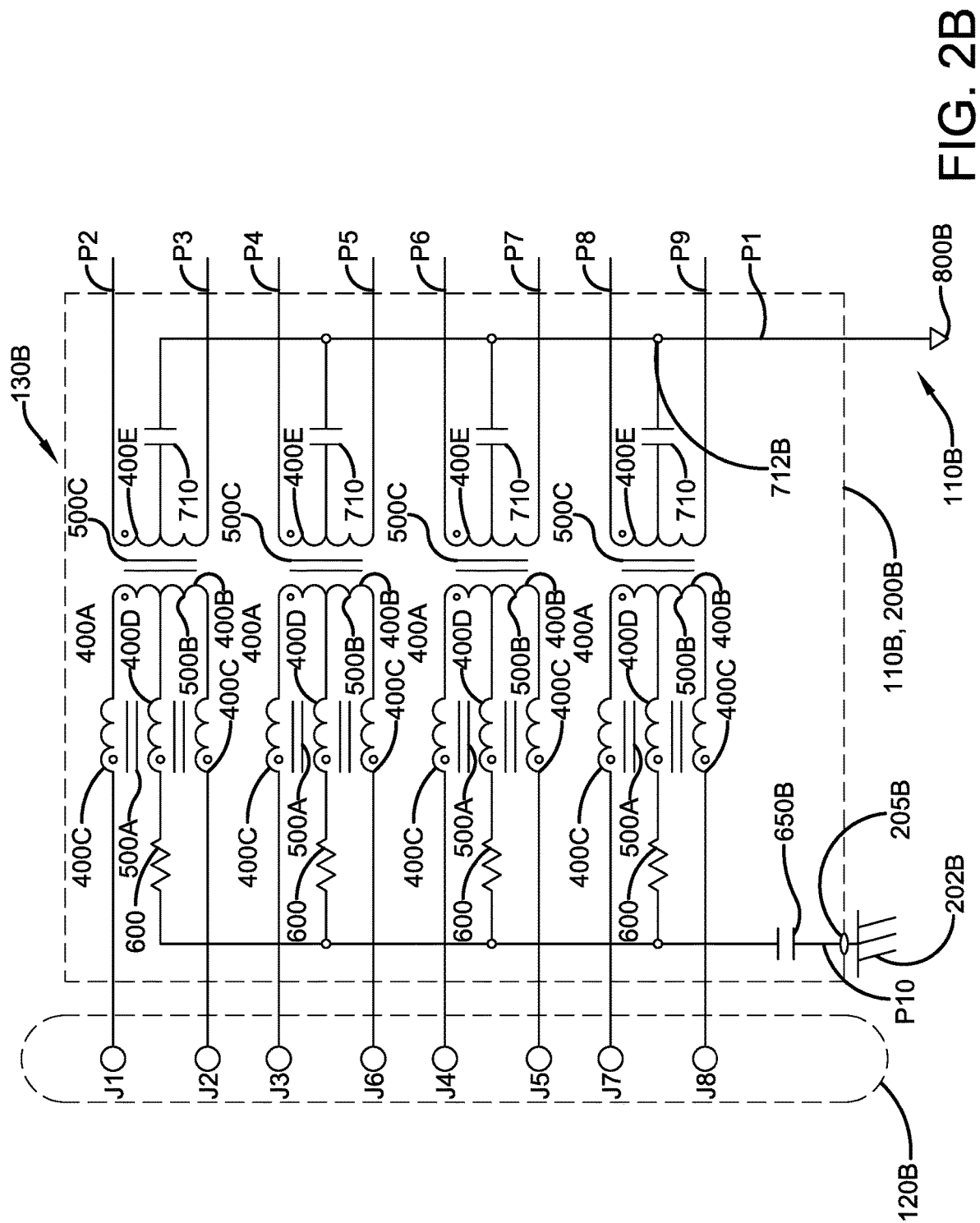
FIG. 2B is a schematic diagram of an output module of the common-mode in-line RF filter isolator in accordance with the various embodiments disclosed herein.

A common-mode in-line radio frequency (RF) filter isolator is generally referred to by numeral 100, as shown in FIG. 1 of the drawings. The filter 100 includes an input module 110A and an output module 110B. The input module 110A and the output module 110B include respective communication interfaces 120A and 120B, and respective filter circuits 130A and 130B, shown in FIGS. 2A-B, which are each configured to be coupled to a network communication line or cable in a manner to be discussed. In particular, each of the filter circuits 130A-B include a common mode choke. Moreover, the input module 110A and the output module 110B are structurally equivalent and are placed into electrical communication with each other via interface 140, which will be discussed in detail below. It should be appreciated that the input module 110A and the output module 110B may each comprise a 1x1 tab-down gigabit short body RJ-45 jack (incorporating a common mode choke), such as that provided under the trademark FASTJACK, by Halo electronics, Inc.

Figure 4:
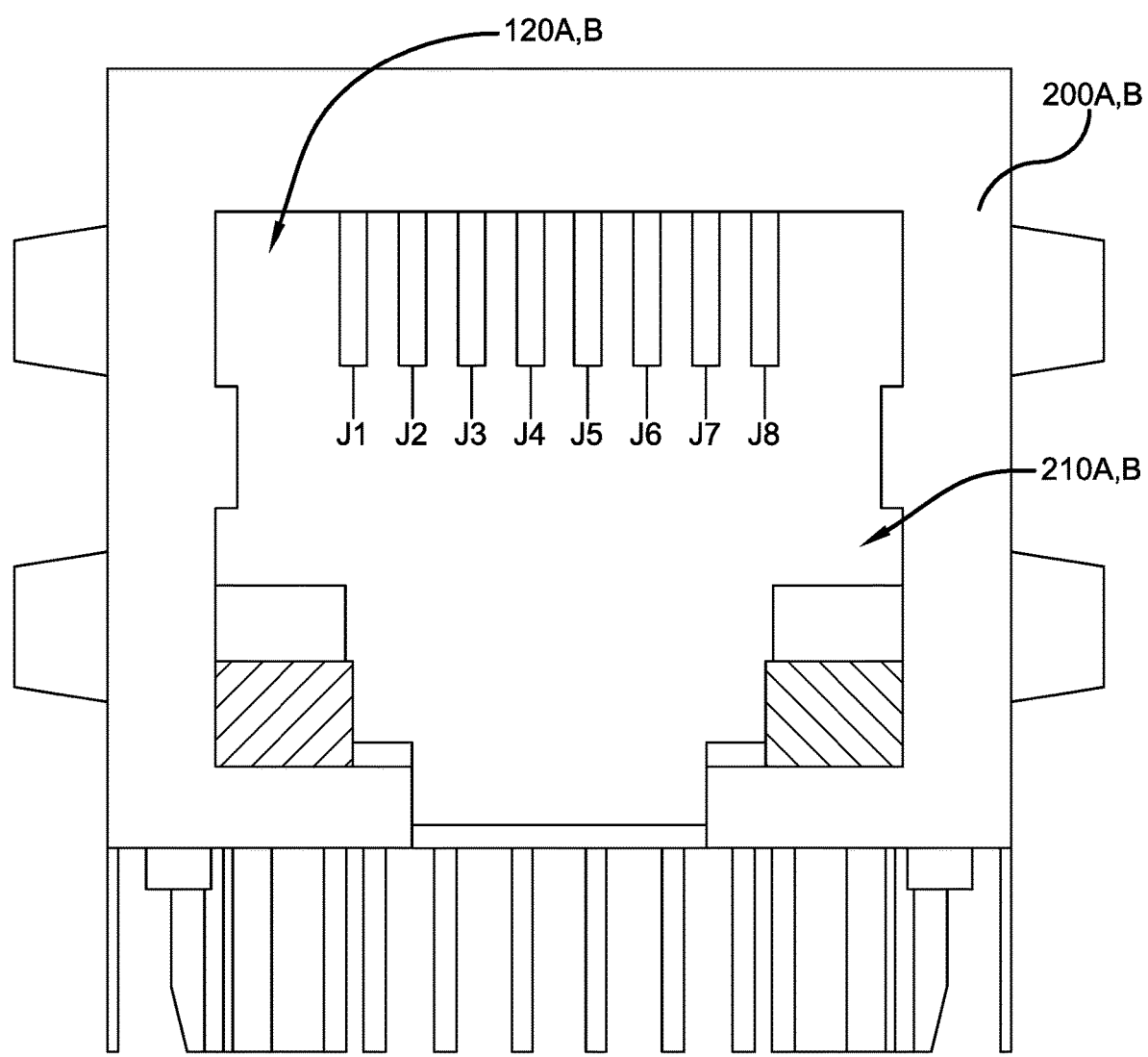
FIG. 4 is an elevational view of an RJ-45 interface in accordance with the concepts of the various embodiments disclosed herein.

The input module 110A and the output module 110B have an electrically conductive outer body or shell 200A and 200B, respectively. For example, the outer body or shell 200A-B may be at least partially formed of aluminum, steel, or any other electrically conductive material. It should also be appreciated that the conductive body or shell 200A-B forms electrical chassis grounds 202A-B at respective nodes 205A-B for the various electrical components carried within the respective modules 110A-B to be discussed. The input and output modules 110A and 110B include respective communication interfaces 120A and 120B having electronic communication pin/terminals/lines "J", which are shown clearly in FIG. 4. It should be appreciated that the communication interfaces 120A-B may comprise any suitable communication port/terminal/connector, including but not limited to a male or female Ethernet connector, or USB (Universal Serial Bus) connector for example. In some embodiments, the bodies 200A-B include respective receiving ports 210A and 210B and electronic communication pins/terminals/lines J1-J8. The receiving ports 210 A-B and communication pins/terminals/lines J1-J8 are configured or arranged to removably receive any suitable connector that utilizes up to an 8 position 8 contact (8P8C) connector, such as an RJ-45 connector, to which a cable having up to 8 conductors, such as an ETHERNET cable, is attached. It should be appreciated that the ports 210A-B and pins/terminals/lines "J" may be configured to be compatible with any suitable communication cable and connector, such as those that conform to standards defined by the Telecommunications Industry Association (TIA), including but not limited to ANSI/TIA-568 for example. In some embodiments, the communication pins/terminals/lines J1-J8 may be separately provided or used independently of the body 200. It should be appreciated that in other embodiments, one or more of the bodies 200A-B may include therein the associated filter circuit 130A-B, but is not necessary, as such circuits 130A-B may be provided separately from the bodies 200A-B. Furthermore, the bodies 200A-B may be formed of any suitable material, such as metal, plastic, as well as any combination thereof, and the like.

Figure 3:
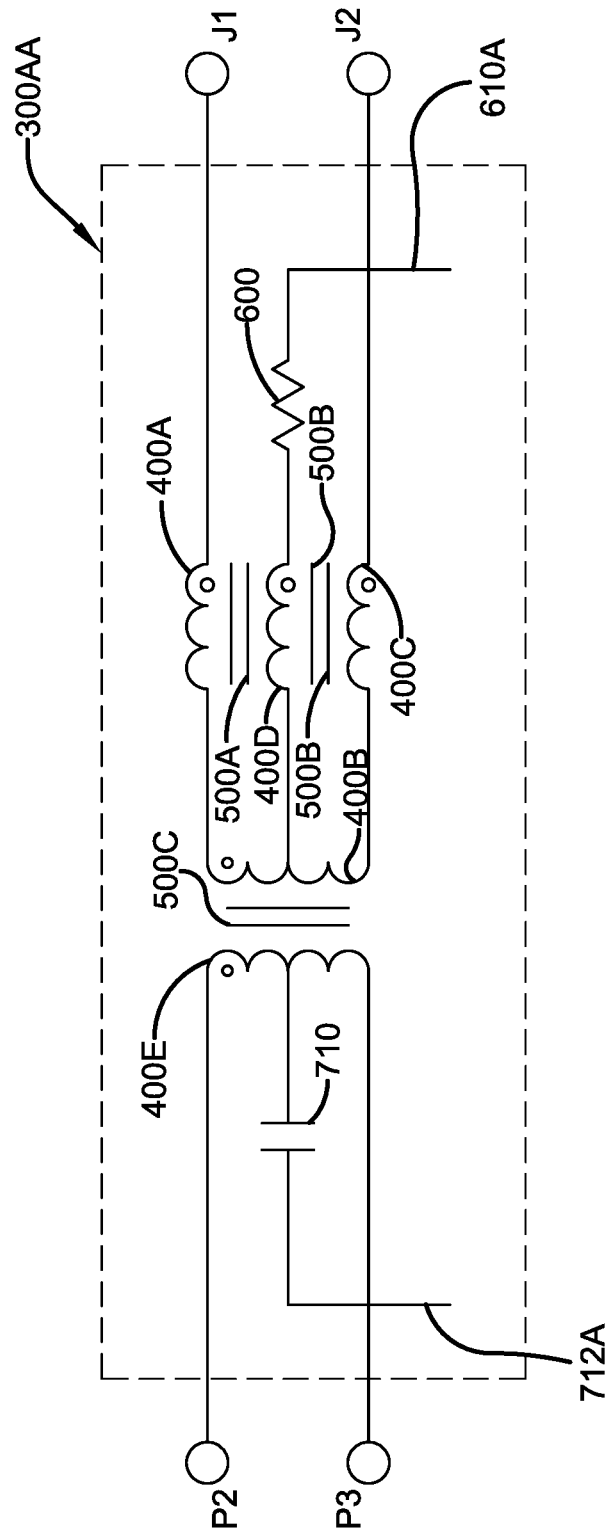
FIG. 3 is a schematic diagram of a filter module of a filter circuit that is provided by the input module of FIG. 2A in accordance with the various embodiments disclosed herein.

Because the filter circuit 130A and the filter circuit 130B are arranged as mirror images of each other in the common-mode in-line filter isolator 100, only the structural components of filter circuit 130A will be presented herein for the sake of brevity. Furthermore, because the filter circuit 130A includes structurally equivalent filter modules 300AA, 300AB, 300AC and 300AD, only the structural components of filter module 300AA will be discussed herein. As such, filter module 300AA, shown clearly in FIG. 3, includes electrically conductive wire coils 400A, 400B, 400C, 400D, and 400E, whereby coils 400A, 400B and 400C are series connected between pins J1 and J2. Coil 400A, along with coils 400D and 400C, which are wound about respective ferromagnetic cores 500A and 500B, form inductors. In addition, one end of coil 400D is coupled to coil 400B while the other end of coil 400D is series coupled to a resistor 600, while the other end of the resistor 600 is coupled to a node 610A.

Continuing, the coil 400E of the of the filter module 300AA is arranged between electrical connection lines P2 and P3, which are coupled to the interface 140. Coils 400B and 400E are wound about a ferromagnetic core 500C to form a common-mode choke. That is, connection pins/terminals/lines J1 and J2 and connection lines P2 and P3 and their respective windings 400B and 400E, which are wrapped around the ferromagnetic core 500C form a common-mode choke. In addition, a capacitor 710 is coupled at one end to coil 400E and at another end to node 712A that is coupled to the interface 140.

As previously discussed, filter modules 300AB, 300AC and 300AD are structurally equivalent to filter module 300AA. Thus, each resistor 600 of filter modules 300AA, 300AB, 300AC and 300AD is coupled between coil 400D and node 610A. In addition, each capacitor 710 of filter modules 300AA, 300AB, 300AC and 300AD is coupled between coil 400E and node 712A. In addition, a capacitor 650A is electrically disposed between node 610A and node 205A, which is coupled to chassis ground 202A (associated with filter circuit 130A) of the input module 110A via line P10, as shown in FIG. 1.

Filter circuit 130B includes filter modules 300BA, 300BB, 300BC and 300BD, which are structurally equivalent to respective filter modules 300AA, 300AB, 300AC and 300AD of the filter circuit 130A. Similarly, nodes 610A and 712A of filter circuit 130A are equivalent to that of nodes 610B and 712B of the filter circuit 130B. Thus, each resistor 600 of filter modules 300BA, 300BB, 300BC and 300BD is coupled between coil 400D and node 610B. Furthermore, each capacitor 710 of filter modules 300BA, 300BB, BC and BD is coupled between coil 400E and node 712B. In addition, a capacitor 650B is electrically disposed between node 610B and node 205B, which is coupled to chassis ground 202B (associated with filter circuit 130B) of the output module 110B via line P10, as shown in FIG. 1.

As such, with reference to FIG. 1, node 712A is coupled to a signal ground 800A via connection line P1, while node 712B is coupled to a signal ground 800B via connection line P1. In addition, connection lines P2 and P3 are associated with filter module 300AA, connection lines P4 and P5 are associated with filter module 300AB, connection lines P6 and P7 are associated with filter module 300AC, and connection lines P8 and P9 are associated with filter module 300AD. Similarly, connection lines P2 and P3 are associated with filter module 300BA, connection lines P4 and P5 are associated with filter module 300BB, connection lines P6 and P7 are associated with filter module 300BC, and connection lines P8 and P9 are associated with filter module 300BD. Interface 140 serves to couple respective connection lines P1-P9 of filter circuit 130A and 130B together. Thus, in some embodiments, the interface 140 is configured so that connection lines P1-P9 of filter circuit 130A are directly coupled to connection lines P1-P9 of filter circuit 130B, so as to electrically couple the filter circuit 130A and 130B together. Whereas connection lines P10 of each of the filter circuits 130A-B are not directly coupled together, but rather are respectively connected to separate chassis grounds 202A and 202B as previously discussed.

Thus, when the common-mode in-line filter 100 is placed into operation, it serves to couple two sections of a wired communication link, such as a network communication link or cable, such as an ETHERNET cable, together. However, it should be appreciated that the wired communication links may take on any suitable wired arrangement and is not required to conform to the ETHERNET standard, so long as the wired communication links are compatible for electrically connecting/interfacing to the filter 100. For example, the connector of one section of ETHERNET cable (first communication link) is removably inserted into the receiving port 210A of the filter 100, while the connector of another section of ETHERNET cable (second communication link) is removably inserted into the receiving port 210B of the filter 100. As a result, the two sections of ETHERNET cable are electrically coupled together, while the common-mode in-line filter 100 provides common-mode filtering to remove unwanted RF interference and noise from the ETHERNET cable to ensure the integrity of the data transmitted via the ETHERNET cable.

It should be appreciated that the various electrical components of the filter 100 may be carried in a portable housing formed of any suitable material, such as metal, plastic, and the like. Alternatively, it should be appreciated that the components of the filter 100 may be carried in a housing formed by the radio transmission equipment and/or the radio receiving equipment itself.

In some embodiments, the filter 100 may be configured to filter RF signals, such as RF signals that are in a frequency range between about 0 to 30 MHz, for example. However, it should be appreciated that the filter 100 may be configured so as to be tuned to filter any desired specific individual frequency or range of frequencies. For example, the frequency, or range of frequencies, that are filtered by the in-line filter 100 may be adjusted, shifted or tuned as desired by changing or modifying the number of turns of the electrically conductive wire coils 400A-E that are wrapped around the ferrite cores 500A-C of one or more of the various filter modules 300 previously discussed.

Still in other embodiments, the filter 100 may be configured to have an input module 110A and an output module 110B that are configured with a single set of common-mode filtering components, which utilizes only one of either filtering circuit 130A or 130B. This filtering circuit 130A or 130B may be locally housed with the input/output module 110A,110B or may be remotely located separate from the input/output module 110A,110B. In yet another embodiment, the filter 100 may be configured to utilize an input module 110A and an output module 110B that are configured to be in electrical communication with remotely located common-mode filtering circuits 130A and 130B, which may be on a PCB (printed circuit board) that is separate from that of the input and output modules 110A,110B.

In still further embodiments, multiple filters 100 may be coupled adjacently, in series to increase the RF filtering effectiveness of the device.

Still yet, in other embodiments, multiple filters may be placed in series, at any desired spacing, between multiple links or sections of ETHERNET cable to achieve desired levels of filtering.

In other embodiments, the input interface 130A and the input interface 130B that are configured to be electrically coupled to the communication links, such as an Ethernet cable, may be formed so that they are integral with the housing of the modules 110A-B.

Figure 5:
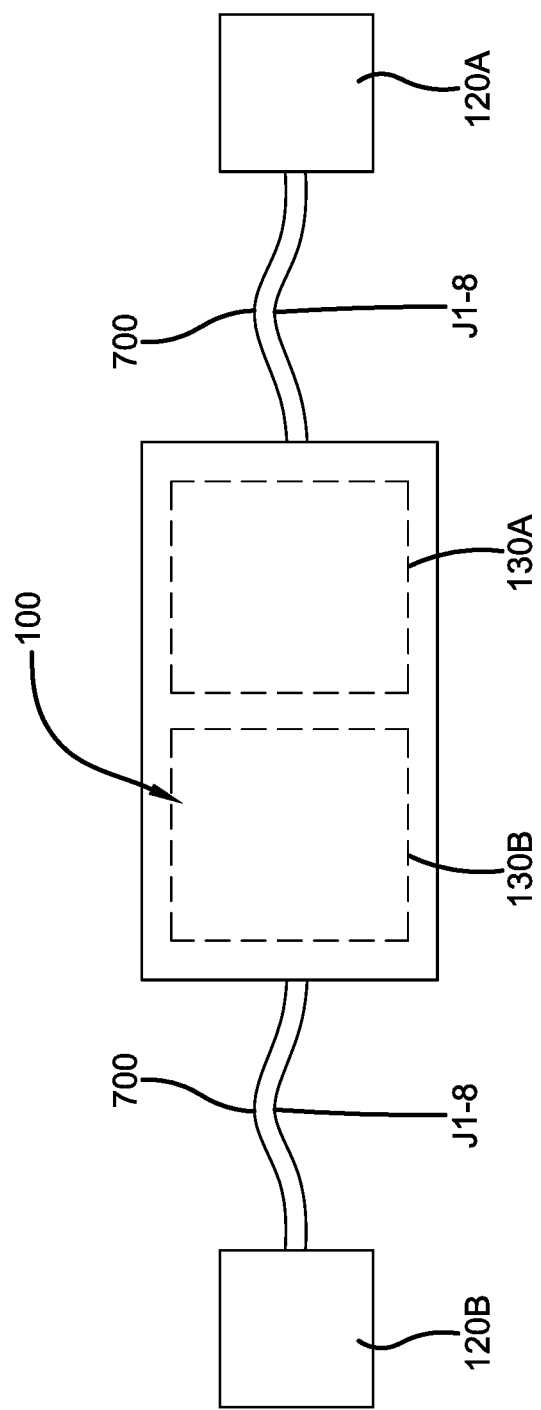
FIG. 5 is a schematic view of an alternative common-mode in-line radio frequency (RF) filter isolator in accordance with the concepts of the various embodiments disclosed herein.

Alternatively, in other embodiments, the input interface 120A and the input interface 120B may be connected to respective filter circuits 130A and 130B by a flexible and/or elongated electrical section 700, as shown in FIG. 5. As such, the filter isolator 100 is configured as a pigtail-style unit. Furthermore, the electrical section 700 may comprise one or more wires, including lines J1-8 shown in FIG. 1. As previously discussed, the communication interfaces 120A-B may comprise any suitable connection port, such as a male or female Ethernet terminal for example.

In further alternative embodiments, the filter isolator 100 may be configured to include only a single filter circuit, such as only filter circuit 130A or only filter circuit 130B. In the case where only the filter circuit 130A is used, the communication interface 120A serves as the first input interface and the connection lines P1-P9 are embodied as the second input interface equivalent to interface 120B. Accordingly, the first and second input interfaces 120A, 120B may comprise any suitable connection port, such as a male or female Ethernet terminal for example. As such, the first input interface 120A and the second input interface 120B may be configured to be placed in-line with a communication link, such as an Ethernet cable, as previously discussed.

It should be appreciated that the first and second input interfaces 120A and 120B may be configured to have any desired physical configuration and be operationally compatible with any communication protocol or standard utilized by the wired communication links and the various connectors/terminals/ports provided by these wired communication links. Thus, for example the first and second interfaces 120A and 120B may be configured to be compatible with USB (Universal Serial Bus), Ethernet as discussed, as well as others.

Therefore, it can be seen that the objects of the various embodiments disclosed herein have been satisfied by the structure and its method for use presented above. While in accordance with the Patent Statutes, only the best mode and preferred embodiments have been presented and described in detail, with it being understood that the embodiments disclosed herein are not limited thereto or thereby. Accordingly, for an appreciation of the true scope and breadth of the embodiments, reference should be made to the following claims.

What is claimed is:

1. A radio-frequency (RF) filter isolator comprising:
a first filter circuit comprising:
a first electrically conductive body including a first plurality of filter modules each configured to filter common-mode noise; and
a first interface in electrical communication with said first plurality of filter modules;
wherein said first electrically conductive body and said first plurality of filter modules are electrically coupled together at a first ground node;
a second filter circuit comprising:
a second electrically conductive body including a second plurality of filter modules each configured to filter common-mode noise, wherein said first and second electrically conductive bodies are separate from each other; and
a second interface in electrical communication with said second plurality of filter modules;
wherein said second electrically conductive body and said second plurality of filter modules are electrically coupled together at a second ground node;
wherein said first interface and said second interface are configured to be selectively electrically coupled in-line with a communication link.

2. The RF filter isolator of claim 1, wherein said first and second plurality of filter modules include a common mode choke.

3. The RF filter isolator of claim 1, wherein said first interface and said second interface are RJ-45 compatible.

4. The RF filter isolator of claim 1, wherein said communication link comprises an Ethernet cable.

5. The RF filter isolator of claim 1, wherein one or more of said first interface and said second interface are each electrically coupled to said filter circuit by a flexible section.

6. The RF filter isolator of claim 1, wherein said first ground node comprises said first electrically conductive body and said second ground node comprises said second electrically conductive body.

7. A radio-frequency (RF) filter isolator comprising:
a first filter circuit configured to filter common-mode noise, wherein said first filter circuit is grounded to a first electrically conductive body; and
a second filter circuit configured to filter common-mode noise, wherein said second filter circuit is grounded to a second electrically conductive body,
wherein said first electrically conductive body and said second electrically conductive body are separate from one another, wherein said first filter circuit includes a first output interface and a first input interface, and said second filter circuit includes a second output interface and a second input interface, wherein said first output interface of said first filter circuit is coupled to said second output interface of said second filter circuit and said first input interface of said first and second filter circuits are adapted to be selectively electrically coupled in-line with a communication link.

8. The RF filter isolator of claim 7, wherein said first input interface and said second input interface are RJ-45 compatible.

9. The RF filter isolator of claim 7, wherein said first filter circuit and said second filter circuit each comprise common-mode chokes.

10. The RF filter isolator of claim 7, wherein the communication link comprises an Ethernet cable.

11. The RF filter isolator of claim 7, wherein one or more of said first input interface and said second input interface are respectively electrically coupled to said first filter circuit and said second filter circuit by a flexible section.

12. The RF filter isolator of claim 7, wherein said first filter circuit includes a plurality of filter modules and second filter circuit includes a plurality of filter modules, and wherein each said filter module includes a common-mode choke.

13. The RF filter isolator of claim 7, wherein said first filter circuit is at least partially disposed within said first electrically conductive body, and wherein said second filter circuit is at least partially disposed within said second electrically conductive body.

* * * * *